(12) United States Patent
Benslimane et al.

(10) Patent No.: US 7,785,905 B2
(45) Date of Patent: Aug. 31, 2010

(54) DIELECTRIC ACTUATOR OR SENSOR STRUCTURE AND METHOD OF MAKING IT

(75) Inventors: Mohamed Yahia Benslimane, Nordborg (DK); Peter Gravesen, Nordborg (DK)

(73) Assignee: Danfoss A/S, Nordborg (DK)

( * ) Notice: Subject to any disclaimer, the term of this patent is extended or adjusted under 35 U.S.C. 154(b) by 154 days.

(21) Appl. No.: 11/973,620

(22) Filed: Oct. 9, 2007

(65) Prior Publication Data

US 2008/0038860 A1 Feb. 14, 2008

Related U.S. Application Data

(62) Division of application No. 10/499,429, filed as application No. PCT/DK02/00862 on Dec. 17, 2002.

(30) Foreign Application Priority Data

Dec. 21, 2001 (DK) ................................ 2001 01933

(51) Int. Cl.
*G01R 31/26* (2006.01)
(52) U.S. Cl. .............................. 438/14; 438/11; 438/17; 438/53; 257/48; 257/415; 257/417; 257/420; 257/E21.521
(58) Field of Classification Search .................. 257/48, 257/415, 417, 420; 438/11, 14, 17, 53
See application file for complete search history.

(56) References Cited

U.S. PATENT DOCUMENTS

| 2,130,532 | A | 9/1938 | Bailey |
| 2,716,708 | A | 8/1955 | Bradfield |
| 3,109,202 | A | 11/1963 | Beckadolph et al. |
| 3,138,962 | A | 6/1964 | Haines Jr., et al. |
| 3,544,733 | A | 12/1970 | Reylek |
| 3,565,195 | A | 2/1971 | Miller et al. ................. 177/210 |

(Continued)

FOREIGN PATENT DOCUMENTS

DE 30 06 620 A1 9/1981

(Continued)

OTHER PUBLICATIONS

Publication "High-field electrostriction of elastomeric polymer dielectrics for actuation" by Roy Kornbluh, et al., SRI International; SPIE vol. 3669, pp. 149-161; Mar. 1999.

(Continued)

*Primary Examiner*—Wai-Sing Louie
(74) *Attorney, Agent, or Firm*—McCormick, Paulding & Huber LLP

(57) ABSTRACT

The present invention relates to dielectric actuators or sensors of the kind wherein electrostatic attraction between two electrodes located on an elastomeric body leads to a compression of the body in a first direction and a corresponding extension of the body in a second direction. The dielectric actuator/sensor structure comprises a first sheet of elastomeric material having at least one smooth surface and a second surface and a second sheet of elastomeric material having at least one smooth surface and a second surface. The sheets are laminated together with their second surfaces exposed, and there is provided a first electrode on the second surface of the first sheet and second electrode on the second surface of the second sheet.

29 Claims, 1 Drawing Sheet

U.S. PATENT DOCUMENTS

| | | | |
|---|---|---|---|
| 3,753,294 A | 8/1973 | Attali et al. ................... 33/133 |
| 3,831,629 A | 8/1974 | Mackel et al. |
| 3,875,481 A | 4/1975 | Miller et al. ................. 317/246 |
| 3,898,585 A | 8/1975 | Heidrich et al. |
| 3,912,830 A | 10/1975 | Murayama et al. |
| 4,259,607 A | 3/1981 | Noguchi et al. |
| 4,266,263 A | 5/1981 | Haberl et al. ................. 361/283 |
| 4,322,877 A | 4/1982 | Taylor |
| 4,330,730 A | 5/1982 | Kurz et al. ................... 310/331 |
| 4,370,697 A | 1/1983 | Haberl et al. ................. 361/283 |
| 4,376,302 A | 3/1983 | Miller ......................... 367/157 |
| 4,384,394 A | 5/1983 | Lemmonon et al. ........ 29/25.35 |
| 4,386,386 A | 5/1983 | Akita .......................... 361/283 |
| 4,431,882 A | 2/1984 | Frame ............................ 200/5 |
| 4,494,409 A | 1/1985 | Kondo et al. .................. 73/651 |
| 4,634,917 A | 1/1987 | Dvorsky et al. ............. 310/328 |
| 4,654,546 A | 3/1987 | Kirjavainen ................ 307/400 |
| 4,731,694 A | 3/1988 | Grabner et al. .............. 361/280 |
| 4,825,116 A | 4/1989 | Itoh et al. .................... 310/335 |
| 4,829,812 A | 5/1989 | Parks et al. .................... 73/12 |
| 4,836,033 A * | 6/1989 | Seitz ....................... 73/862.046 |
| 4,852,443 A | 8/1989 | Duncan et al. ................ 84/1.04 |
| 4,866,412 A | 9/1989 | Rzepczynski ............... 338/114 |
| 4,879,698 A | 11/1989 | Langberg .................... 367/140 |
| 4,986,136 A | 1/1991 | Brunner et al. .......... 73/862.04 |
| 5,060,527 A | 10/1991 | Burgess ................. 73/862.68 |
| 5,090,246 A | 2/1992 | Colla et al. .................... 73/718 |
| 5,090,248 A | 2/1992 | Cimmino et al. .............. 73/780 |
| 5,115,680 A | 5/1992 | Lew ............................. 73/763 |
| 5,172,024 A | 12/1992 | Broussoux et al. |
| 5,173,162 A | 12/1992 | Hagimura et al. ........... 204/299 |
| 5,255,972 A | 10/1993 | Shirasu ........................ 60/528 |
| 5,259,099 A | 11/1993 | Banno et al. |
| 5,300,813 A | 4/1994 | Joshi et al. |
| 5,321,332 A | 6/1994 | Toda .......................... 310/322 |
| 5,325,012 A | 6/1994 | Sato et al. |
| 5,341,062 A | 8/1994 | Cero, Jr. et al. |
| 5,410,210 A | 4/1995 | Sato et al. .................... 310/363 |
| 5,425,275 A | 6/1995 | Lockshaw .................... 73/775 |
| 5,447,076 A | 9/1995 | Ziegler ................. 73/862.626 |
| 5,449,002 A | 9/1995 | Goldman .................... 128/779 |
| 5,515,341 A | 5/1996 | Toda et al. |
| 5,528,452 A | 6/1996 | Ko ........................... 361/283.4 |
| 5,548,564 A | 8/1996 | Smith ......................... 367/140 |
| 5,559,387 A | 9/1996 | Beurrier |
| 5,642,015 A | 6/1997 | Whitehead et al. |
| 5,755,909 A | 5/1998 | Gailus ....................... 156/229 |
| 5,817,099 A | 10/1998 | Skolik et al. |
| 5,841,143 A | 11/1998 | Tuma et al. ............... 250/458.1 |
| 5,888,646 A | 3/1999 | Takahashi et al. |
| 5,891,065 A | 4/1999 | Cariapa et al. |
| 5,977,685 A | 11/1999 | Kurita et al. ................. 310/311 |
| 6,008,580 A | 12/1999 | Nakamura et al. |
| 6,008,583 A * | 12/1999 | Breuer et al. ................ 313/594 |
| 6,108,175 A | 8/2000 | Hawwa et al. |
| RE37,065 E | 2/2001 | Grahn .......................... 73/628 |
| 6,208,065 B1 | 3/2001 | Ueyama |
| 6,210,514 B1 | 4/2001 | Cheung et al. .............. 156/241 |
| 6,255,758 B1 | 7/2001 | Cabuz et al. |
| 6,282,956 B1 | 9/2001 | Okada ..................... 73/504.12 |
| 6,343,129 B1 | 1/2002 | Pelrine et al. ............... 381/191 |
| 6,376,971 B1 * | 4/2002 | Pelrine et al. ............... 310/363 |
| 6,411,015 B1 | 6/2002 | Toda |
| 6,437,489 B1 | 8/2002 | Shinke et al. ............... 310/369 |
| 6,543,110 B1 | 4/2003 | Pelrine et al. .............. 29/25.35 |
| 6,545,384 B1 | 4/2003 | Pelrine et al. ............... 310/309 |
| 6,545,395 B2 | 4/2003 | Matsui et al. ............... 310/369 |
| 6,581,481 B1 | 6/2003 | Perusek ................. 73/862.337 |
| 6,583,533 B2 | 6/2003 | Pelrine et al. ............... 310/309 |
| 6,586,859 B2 | 7/2003 | Kornbluh et al. ............ 310/309 |
| 6,628,040 B2 | 9/2003 | Pelrine et al. ............... 310/307 |
| 6,662,658 B2 | 12/2003 | Foote ....................... 73/514.29 |
| 6,664,718 B2 | 12/2003 | Pelrine et al. ............... 310/800 |
| 6,700,304 B1 | 3/2004 | Fuller et al. |
| 6,700,312 B2 | 3/2004 | Iizuka et al. |
| 6,707,236 B2 | 3/2004 | Pelrine et al. ............... 310/800 |
| 6,759,769 B2 | 7/2004 | Kirjavainen |
| 6,768,246 B2 | 7/2004 | Pelrine et al. ............... 310/339 |
| 6,781,284 B1 | 8/2004 | Pelrine et al. ............... 310/330 |
| 6,806,621 B2 | 10/2004 | Heim et al. .................. 310/328 |
| 6,809,462 B2 | 10/2004 | Pelrine et al. ............... 310/800 |
| 6,812,624 B1 | 11/2004 | Pei et al. ..................... 310/800 |
| 6,876,135 B2 | 4/2005 | Pelrine et al. ............... 310/339 |
| 6,882,086 B2 | 4/2005 | Kornbluh et al. ............ 310/328 |
| 6,891,317 B2 | 5/2005 | Pei et al. ..................... 310/800 |
| 6,911,764 B2 | 6/2005 | Pelrine et al. ............... 310/328 |
| 6,940,211 B2 | 9/2005 | Pelrine et al. ............... 310/330 |
| 7,034,432 B1 | 4/2006 | Pelrine et al. ............... 310/309 |
| 7,049,732 B2 | 5/2006 | Pei et al. ..................... 310/800 |
| 7,064,472 B2 | 6/2006 | Pelrine et al. ............... 310/324 |
| 7,104,146 B2 | 9/2006 | Benslimane et al. ... 73/862.626 |
| 7,211,937 B2 | 5/2007 | Kornbluh et al. |
| 7,518,284 B2 | 4/2009 | Benslimane et al. |
| 7,548,015 B2 | 6/2009 | Benslimane et al. |
| 7,573,064 B2 | 8/2009 | Benslimane et al. |
| 2001/0026165 A1 | 10/2001 | Pelrine et al. ............... 324/750 |
| 2001/0035723 A1 | 11/2001 | Pelrine et al. ............... 318/116 |
| 2002/0008445 A1 | 1/2002 | Pelrine et al. ............... 310/330 |
| 2002/0041017 A1 * | 4/2002 | Hauser et al. ............... 257/678 |
| 2002/0050768 A1 | 5/2002 | Beck et al. .................. 310/334 |
| 2002/0130673 A1 | 9/2002 | Pelrine et al. ............... 324/727 |
| 2002/0175594 A1 | 11/2002 | Kornbluh et al. ............ 310/317 |
| 2002/0175598 A1 | 11/2002 | Heim et al. .................. 310/328 |
| 2002/0185937 A1 | 12/2002 | Heim et al. .................. 310/339 |
| 2003/0006669 A1 | 1/2003 | Pei et al. ..................... 310/309 |
| 2003/0066741 A1 | 4/2003 | Burgess et al. ............ 200/61.43 |
| 2003/0067245 A1 | 4/2003 | Pelrine et al. ............... 310/311 |
| 2003/0125781 A1 | 7/2003 | Dohno et al. .................. 607/75 |
| 2003/0141473 A1 | 7/2003 | Pelrine et al. ........... 251/129.06 |
| 2003/0141787 A1 | 7/2003 | Pelrine et al. ............... 310/365 |
| 2003/0213960 A1 | 11/2003 | Kitagawa et al. |
| 2003/0214199 A1 | 11/2003 | Heim et al. .................. 310/309 |
| 2004/0008853 A1 | 1/2004 | Pelrine et al. ............... 381/191 |
| 2004/0012301 A1 | 1/2004 | Benslimane et al. ........ 310/311 |
| 2004/0056567 A1 | 3/2004 | Menzel |
| 2004/0124738 A1 | 7/2004 | Pelrine et al. ............... 310/307 |
| 2004/0217671 A1 | 11/2004 | Rosenthal et al. ........... 310/328 |
| 2004/0232807 A1 | 11/2004 | Pelrine et al. ............... 310/800 |
| 2004/0263028 A1 | 12/2004 | Pei et al. ..................... 310/800 |
| 2005/0040736 A1 | 2/2005 | Topliss et al. ............... 310/367 |
| 2005/0104145 A1 | 5/2005 | Benslimane et al. ........ 257/415 |
| 2005/0157893 A1 | 7/2005 | Pelrine et al. ............... 381/190 |
| 2006/0016275 A1 | 1/2006 | Gravesen et al. ....... 73/862.042 |
| 2006/0066183 A1 | 3/2006 | Benslimand et al. ........ 310/369 |
| 2006/0079824 A1 | 4/2006 | Munch-Fals et al. |
| 2006/0113878 A1 | 6/2006 | Pei et al. ..................... 310/363 |
| 2006/0113880 A1 | 6/2006 | Pei et al. ..................... 310/800 |
| 2006/0119225 A1 | 6/2006 | Heim et al. .................. 310/339 |
| 2006/0158065 A1 | 7/2006 | Pelrine et al. ............... 310/328 |
| 2007/0114885 A1 | 5/2007 | Benslimane et al. |
| 2007/0116858 A1 | 5/2007 | Benslimane et al. |
| 2007/0269585 A1 | 11/2007 | Benslimane et al. |
| 2007/0277356 A1 | 12/2007 | Benslimane et al. |
| 2008/0093954 A1 | 4/2008 | Benslimand et al. |
| 2008/0226878 A1 | 9/2008 | Benslimane et al. |
| 2008/0238258 A1 | 10/2008 | Ishiguro et al. |
| 2008/0265709 A1 | 10/2008 | Clausen et al. |
| 2009/0064476 A1 | 3/2009 | Cross et al. |
| 2009/0072658 A1 | 3/2009 | Benslimane et al. |
| 2009/0169829 A1 | 7/2009 | Benslimane et al. |

| | | | |
|---|---|---|---|
| 2009/0239039 A1 | 9/2009 | Benslimane et al. | |

FOREIGN PATENT DOCUMENTS

| | | | |
|---|---|---|---|
| DE | 30 23 218 A1 | 2/1982 |
| DE | 38 41 243 A1 | 6/1990 |
| DE | 198 26 391 A1 | 12/1999 |
| DE | 200 04 248 U1 | 8/2000 |
| DE | 100 54 247 A1 | 5/2002 |
| EP | 0 387 180 A1 | 9/1990 |
| EP | 0 855 307 B1 | 3/2003 |
| EP | 148 1738 A2 | 12/2004 |
| FR | 2 309 833 | 12/1976 |
| FR | 2 793 937 A1 | 11/2000 |
| GB | 2 042 256 A | 9/1980 |
| JP | 55-42474 | 3/1980 |
| JP | 55-91299 | 7/1980 |
| JP | 1-273372 | 11/1989 |
| JP | 2002-237625 | 8/2003 |
| JP | 2005-117103 | 4/2005 |
| JP | 2007-11206 A | 1/2007 |
| JP | 2008-205180 A | 9/2008 |
| KR | 90-1465 | 3/1990 |
| WO | WO 96/34701 | 11/1996 |
| WO | WO 97/27822 | 8/1997 |
| WO | WO 00/66970 | 11/2000 |
| WO | WO 01/06575 A1 | 1/2001 |
| WO | WO 01/06579 A2 | 1/2001 |
| WO | WO 01/58973 A2 | 8/2001 |
| WO | WO 01/059852 A3 | 8/2001 |
| WO | WO 01/63738 A2 | 8/2001 |
| WO | WO 01/065615 A3 | 9/2001 |
| WO | WO 02/37660 A1 | 5/2002 |
| WO | WO 2004/079832 A2 | 9/2004 |
| WO | WO 2005/079187 A2 | 9/2005 |
| WO | WO 2005/081676 A2 | 9/2005 |

OTHER PUBLICATIONS

Publication Micro-Electro-Mechanical Systems (MEMS)—2000-; by R. Trujillo, et al.; Presented at 2000 ASIME International Mechanical Engineering Congress and Exposition, Nov. 5-10, 2000; Orland, FL; pp. 709-716.

International Search Report for Serial No. PCT/DK03/00603 dated Feb. 5, 2004.

PCT Search Report for Serial No. PCT/DK03/00848 dated Mar. 25, 2004.

Article entitled "Electrostrictive Polymer Artificial Muscle Actuators" by R. Kornbluh, et al., SRI International, Proceedings of the 1998 IEEE International Conference on Robotics & Automation, Belgium, May 1998; pp. 2147-2154.

Article entitled "Spontaneous formation of ordered structures in thin films of metals supported on an elastomeric polymer" by Ned Bowden, et al., Nature, vol. 393, May 14, 1998; pp. 146-149.

Article entitled "Silicone Elastomers with Controlled Surface Composition Using Argon or Hydrogen Plasma Treatment" by B. Orlander, et al., Journal of Applied Polymer Science, vol. 90, 2003 Wiley Periodicals, Inc.; pp. 1378-1383.

* cited by examiner

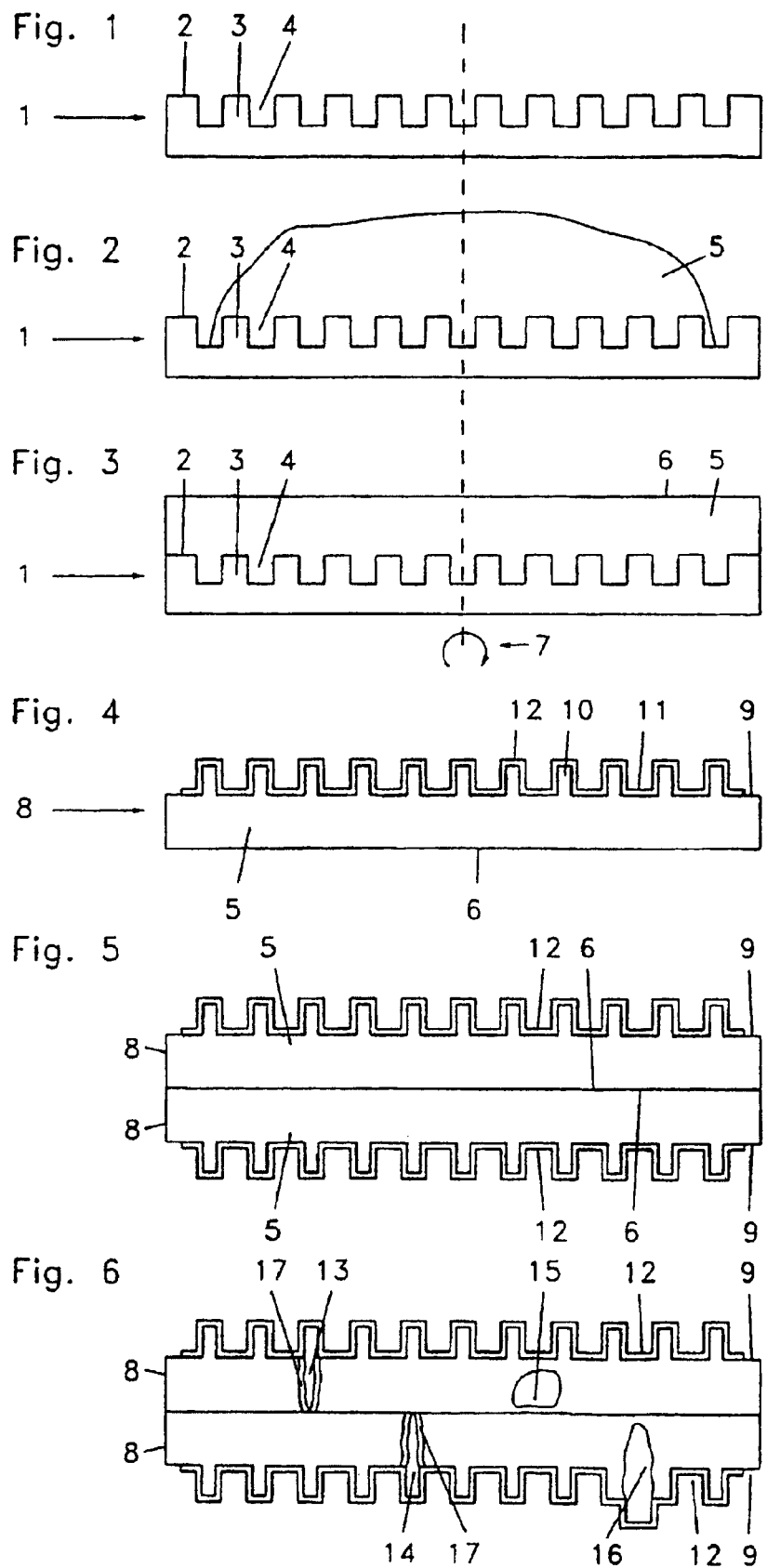

DIELECTRIC ACTUATOR OR SENSOR STRUCTURE AND METHOD OF MAKING IT

CROSS-REFERENCE TO RELATED APPLICATIONS

This application is a Divisional Application of U.S. Ser. No. 10/499,429 entitled "Dielectric Actuator or Sensor Structure and Method of Making It" to Mohamed Y. Benslimane, et al. filed on Dec. 30, 2004 and claims the benefit of the filing date thereof under U.S.C. §120 and incorporates it by reference herein. The present invention also claims priority from and incorporates by reference essential subject matter disclosed in International Application No. PCT/DK02/00862 filed on Dec. 17, 2002 and Danish Patent Application No. PA 2001 01933 filed on Dec. 21, 2001.

FIELD OF THE INVENTION

The present invention relates to dielectric actuators of the kind wherein electrostatic attraction between two electrodes located on an elastomeric body leads to a compression of the body in a first direction and a corresponding extension of the body in a second direction.

BACKGROUND OF THE INVENTION

Such actuators may be employed as force sensors by operating the electrodes as the plates of a capacitor. In this mode of operation, compression of the elastomeric body by an external force will reduce the distance between the electrodes, causing an increase in capacitance of the electrode capacitor which can be measured to indicate the magnitude of the force.

It is an object of the invention to provide a dielectric actuator/sensor structure which is easy to produce and tolerant of production defects such as pinholes, cracks and inclusions in the body thereof. It is a further object of the invention to provide a method of making a dielectric actuator/sensor structure which provides a high yield while having advantages of simplicity and economy.

SUMMARY OF THE INVENTION

In accordance with one aspect of the invention, a dielectric actuator/sensor structure comprises a first sheet of elastomeric material having at least one smooth surface and a second surface and a second sheet of elastomeric material having at least one smooth surface and a second surface. The sheets are laminated together with their second surfaces exposed, and there is provided a first electrode on the second surface of the first sheet and a second electrode on the second surface of the second sheet.

In accordance with another aspect of the invention, a method of making a dielectric actuator/sensor structure comprises the steps of: a) providing a generally planar mould, b) casting a layer of elastomeric material in the mould, c) causing the layer to have a smooth surface and a second surface, d) curing the layer, and e) removing the layer from the mould to provide an elastomeric sheet having a smooth surface and a second surface. These steps are repeated in a step e) to provide a second elastomeric sheet having a smooth surface and a second surface. Electrodes are made on the sheets in a step f of depositing at least one electrically conductive layer on the second surface of each elastomeric sheet. The sheets are assembled into a finished actuator/sensor structure by g) laminating the elastomeric sheets together with their second surfaces exposed.

The laminated structure is a key factor in achieving production "robustness". Consider, for example, the existence of minor defects such as pinholes, cracks or inclusions in each sheet. Even if cleanliness is observed in producing the sheets, a significant number of such defects may exist, even though it is only a minor number. In a single-sheet dielectric actuator/sensor, such defects may reduce the breakdown voltage between the electrodes by as much as 95% or even cause direct shorting of the electrodes.

Laminating two sheets together to form the final structure substantially eliminates this problem. As a starting point it can typically be assured by proper control of production that only a minor number of defects will exist and be spread randomly across each sheet. This in turn makes it very unlikely that two defects will be co-located in the assembled structure. Therefore, even if one layer of the assembled structure has a defect in a certain location, the other layer of the structure will most likely be defect-free in the same location. As a consequence, the probability of direct shorts is for all practical considerations reduced to zero, and the reduction of breakdown voltage from inclusions is limited to 50% at most.

BRIEF DESCRIPTION OF THE DRAWINGS

Preferred embodiments of the invention will now be described with reference to the accompanying drawings.

FIG. 1 shows a generally planar mould having a micro-corrugated surface.

FIG. 2 shows a volume of curable elastomeric material poured on the mould.

FIG. 3 shows the effect of spinning the mould to smoothen the free surface of the elastomeric material.

FIG. 4 shows the elastomeric material removed from the mould as a sheet and provided with an electrode on its corrugated surface.

FIG. 5 shows two sheets laminated together to form a dielectric actuator/sensor structure.

FIG. 6 illustrates the passivation of defects such as pinholes and inclusions by virtue of the laminated construction of the dielectric actuator/sensor structure.

DETAILED DESCRIPTION OF THE PREFERRED EMBODIMENTS

The generally planar mould 1 in FIG. 1 has a micro-corrugated surface 2 with ridges 3 and grooves 4. The ridges and grooves run in parallel along a direction which is transverse to the plane of the paper. The peak-to-peak amplitude of the corrugations 3, 4 is typically between 1 and 10 micrometers whereas the overall size of the mould is in the range of 5-10 centimeters across the corrugated surface or more. It is obvious that the drawing is not to scale and that the corrugations have been exaggerated for illustration. The mould may be manufactured from any suitable material such as metal or silicon, and the corrugation may be produced by conventional photolithographic or holographic processes.

In FIG. 2, a volume of curable elastomeric material 5 has been poured on the mould 1. The material may be a silicone rubber, for example.

In FIG. 3, the elastomeric material 5 has been shaped into a sheet-like layer having a smooth upper surface 6, by spinning the mould as indicated at 7. Such spinning processes are well-known in the art of photolithography. An alternative way of causing the formation of a smooth upper surface 6 on the elastomeric layer 5 would be by pressing it into shape with a smooth die. After spinning or press-shaping, the elastomeric layer 5 is cured, which may just involve letting it sit on the mould for a certain amount of time, depending on the characteristics of the material.

FIG. 4 shows the elastomeric layer 5 removed from the mould to form a sheet 8 and turned upside down. Removing the sheet from the mould has exposed its second surface 9, which is patterned with corrugations 10 and 11 as the surface of the mould. An electrode 12 has been deposited on the surface 9. This may be done by vapor deposition of a metal such as silver, or by electrolytic techniques, for example.

The sheet 8 typically has a thickness of about 10-50 micrometers and the electrodes have a thickness of about 20-100 nanometers.

FIG. 5 shows a dielectric actuator/sensor structure assembled from two sheets 9 of the kind made and structured as just described. The sheets are laminated together with their smooth surfaces 6 touching each other and their second surfaces 9 exposed. Lamination is preferably done under vacuum to prevent the inclusion of gas bubbles between the sheets.

The corrugation of the exposed surfaces makes the laminated assembly highly anisotropic in its elastic behaviour. To this end, it is preferred to laminate the sheets together with the corrugations of both sheets running in parallel. In operation, a high voltage is applied between the electrodes on the corrugated surfaces. Electrostatic attraction between the electrodes will then tend to compress the structure. Facilitated by the corrugations, this compression will cause the structure to extend in length as its volume will tend to remain constant. Substantially no transverse change of dimensions (transverse to the paper plane) will occur because of the presence of the metallic electrodes on the anisotropic corrugations.

FIG. 6 illustrates the beneficial effects of the laminated structure with respect to defects and inclusions. Each sheet is shown with a pinhole 13, 14 and an inclusion 15, 16 of a metallic object. In a single-layer structure, the presence of pinholes 13 or 14 would cause a short between the electrodes 12 because electrode deposition runs down into the pinholes as shown at 17. Metallic inclusions 15, 16 reduce the remaining thickness of the elastomeric material 5, which serves as an insulator between the electrodes 12. In a single-layer structure, this may reduce the breakdown voltage between the electrodes severely.

In the laminated structure of FIG. 6, however, there is still a defect-free single layer of elastomeric material between the electrodes 12 at each defect 13, 14, 15, 16. This reduces the occurrence of shorts substantially to zero, and limits the reduction of breakdown voltage to 50% at most. Of course, there is nothing to prevent the accidental co-location of two defects, but with proper cleanliness applied to production generally, the risk of this occuring will be very low indeed and much lower than the risk of defects in a single-layer structure.

It deserves to be mentioned that the laminated construction may be equally beneficially applied to dielectric actuator/sensor structures having patterned electrodes on smooth exposed surfaces to facilitate longitudinal extension, instead of solid electrodes on corrugated exposed surfaces.

What is claimed is:

1. A method of making a dielectric actuator/sensor structure comprising steps of:
   forming a first elastomeric sheet with substantially opposed first and second surfaces;
   forming a second elastomeric sheet with substantially opposed first and second surfaces;
   applying a first electrode to the second surface of the first elastomeric sheet;
   applying a second electrode to the second surface of the second elastomeric sheet; and
   connecting the first surfaces of the first and second elastomeric sheets;
   wherein forming at least one of the first and second elastomeric sheets includes a molding step.

2. The method of claim 1, wherein the first surfaces are substantially smooth.

3. The method of claim 1, wherein at least one of the second surfaces includes corrugations.

4. The method of claim 3, wherein the corrugations have an amplitude of approximately 1 μm to approximately 10 μm.

5. The method of claim 1, wherein the first and second elastomeric sheets are formed from the same elastomeric material.

6. The method of claim 1, wherein forming both the first and second elastomeric sheets includes a molding step.

7. The method of claim 1, wherein the method further comprises a step of manufacturing a mold used in the molding step.

8. The method of claim 7, wherein the mold is manufactured by a photolithographic or a holographic process.

9. The method of claim 1, wherein the molding step includes:
   depositing a curable elastomeric solution onto a mold;
   forming the curable elastomeric solution into a sheet having substantially opposed first and second surfaces;
   curing the sheet; and
   removing the sheet from the mold, the sheet being the first or second elastomeric sheet formed by the molding step.

10. The method of claim 9, wherein the curable elastomeric solution is a curable silicone rubber solution.

11. The method of claim 9, wherein the mold includes corrugations that are imparted to the second surface of the sheet.

12. The method of claim 9, wherein the first surface of the sheet is formed by spinning the mold with the curable elastomeric solution thereon or by pressing the curable elastomeric solution with a smooth die.

13. The method of claim 9, wherein the sheet is formed with a thickness of approximately 10 μm to approximately 50 μm.

14. The method of claim 1, wherein the second surface of at least one of the first and second elastomeric sheets includes corrugations, and the respective first or second electrode is applied to substantially conform to the corrugations.

15. The method of claim 14, wherein the second surface of both of the first and second elastomeric sheets includes corrugations, and both the first and second electrodes are applied to substantially conform to the corrugations.

16. The method of claim 1, wherein at least one of the first and second electrodes is applied by vapor deposition or by an electrolytic technique.

17. The method of claim 1, wherein at least one of the first and second electrodes is applied directly to the corresponding second surface.

18. The method of claim 1, wherein at least one of the first and second electrodes is applied with a thickness of approximately 20 nm to approximately 100 nm.

19. The method of claim 1, wherein at least one of the first and second electrodes is applied before connecting the first surfaces of the first and second elastomeric sheets.

20. The method of claim 1, wherein the first surfaces of the first and second elastomeric sheets are connected under vacuum.

21. The method of claim 1, wherein the second surfaces of the first and second elastomeric sheets include corrugations, and the first surfaces are connected such that the corrugations of the first and second sheets are substantially parallel.

22. A method of making a dielectric actuator/sensor structure comprising steps of:
- molding a first elastomeric sheet with a first surface and a substantially opposed micro-corrugated second surface;
- molding a second elastomeric sheet with a first surface and a substantially opposed micro-corrugated second surface;
- aligning the first and second elastomeric sheets such that the first surfaces are facing each other and corrugations of the micro-corrugated second surfaces are substantially parallel; and
- laminating the first and second elastomeric sheets together on their respective first surfaces.

23. The method of claim 22, wherein the first surfaces are substantially smooth.

24. The method of claim 22, wherein the method further comprises depositing first and second electrodes on respective second surfaces of the first and second elastomeric sheets.

25. A method of making a dielectric actuator/sensor structure comprising steps of:
- molding a first elastomeric sheet with a first surface and a second surface;
- molding a second elastomeric sheet with a first surface and a second surface; and
- connecting first surfaces of the first and second elastomeric sheets;

wherein the second surface of at least one of the first and second elastomeric sheets is formed with micro-corrugations.

26. The method of claim 25, wherein the first and second surfaces of each elastomeric sheet are substantially opposed.

27. The method of claim 25, wherein the first surfaces are substantially smooth.

28. The method of claim 25, wherein the method further comprises applying an electrode to the second surface of at least one of the first and second elastomeric sheets.

29. The method of claim 28, wherein the electrode is applied to the second surface formed with micro-corrugations so as to substantially replicate the micro-corrugations.

* * * * *